United States Patent [19]

Ishii et al.

[11] Patent Number: 5,562,387
[45] Date of Patent: Oct. 8, 1996

[54] DEVICE FOR TRANSFERRING PLATE-LIKE OBJECTS

[75] Inventors: Katsumi Ishii, Kanagawa-ken; Hisashi Kikuchi, Esashi, both of Japan

[73] Assignees: Tokyo Electron Limited, Tokyo; Tokyo Electron Tohoku Limited, Esashi, both of Japan

[21] Appl. No.: 317,751

[22] Filed: Oct. 4, 1994

[30] Foreign Application Priority Data

Oct. 4, 1993 [JP] Japan .................................. 5-271307
Oct. 4, 1993 [JP] Japan .................................. 5-271308

[51] Int. Cl.⁶ .................................................. B65G 1/00
[52] U.S. Cl. .......................... 414/416; 414/937; 414/941; 414/217; 414/662; 414/939; 414/744.2; 414/749; 118/719; 901/46
[58] Field of Search ...................... 414/416, 417, 414/752, 749, 217, 222, 225, 226, 937, 941, 662, 664, 665, 744.8, 668, 607, 744.21, 744.3; 118/719; 901/46

[56] References Cited

U.S. PATENT DOCUMENTS 5,048,164  9/1991  Harima .
5,055,036  10/1991  Asano et al. .
5,183,370  2/1993  Cruz .................................... 414/941 X
5,273,244  12/1993  Ono .
5,297,910  3/1994  Yoshioka et al. ................... 414/937 X
5,364,222  11/1994  Akimoto et al. ......................... 414/416

FOREIGN PATENT DOCUMENTS 300838    12/1988  Japan .................................... 414/416
64-35746   3/1989  Japan .
48439     3/1991  Japan .................................... 414/416
106952    4/1992  Japan .................................... 414/937
74699     3/1993  Japan .................................... 414/941

*Primary Examiner*—Frank E. Werner
*Attorney, Agent, or Firm*—Oblon, Spivak, McClelland, Maier & Neustadt, P.C.

[57] ABSTRACT

A plate-like object carrier device comprising plural arms arranged at a same pitch interval to horizontally support a wafer on each of the arms, a first motor for driving a single arm forward and backward and independently of a group of arms, a second motor for driving the group of arms forward and backward at the same time except the single arm, a power supply for supplying power to the first and second motors, and a controller for selecting whether to supply power only to the first motor or both of the first and second motors.

9 Claims, 9 Drawing Sheets

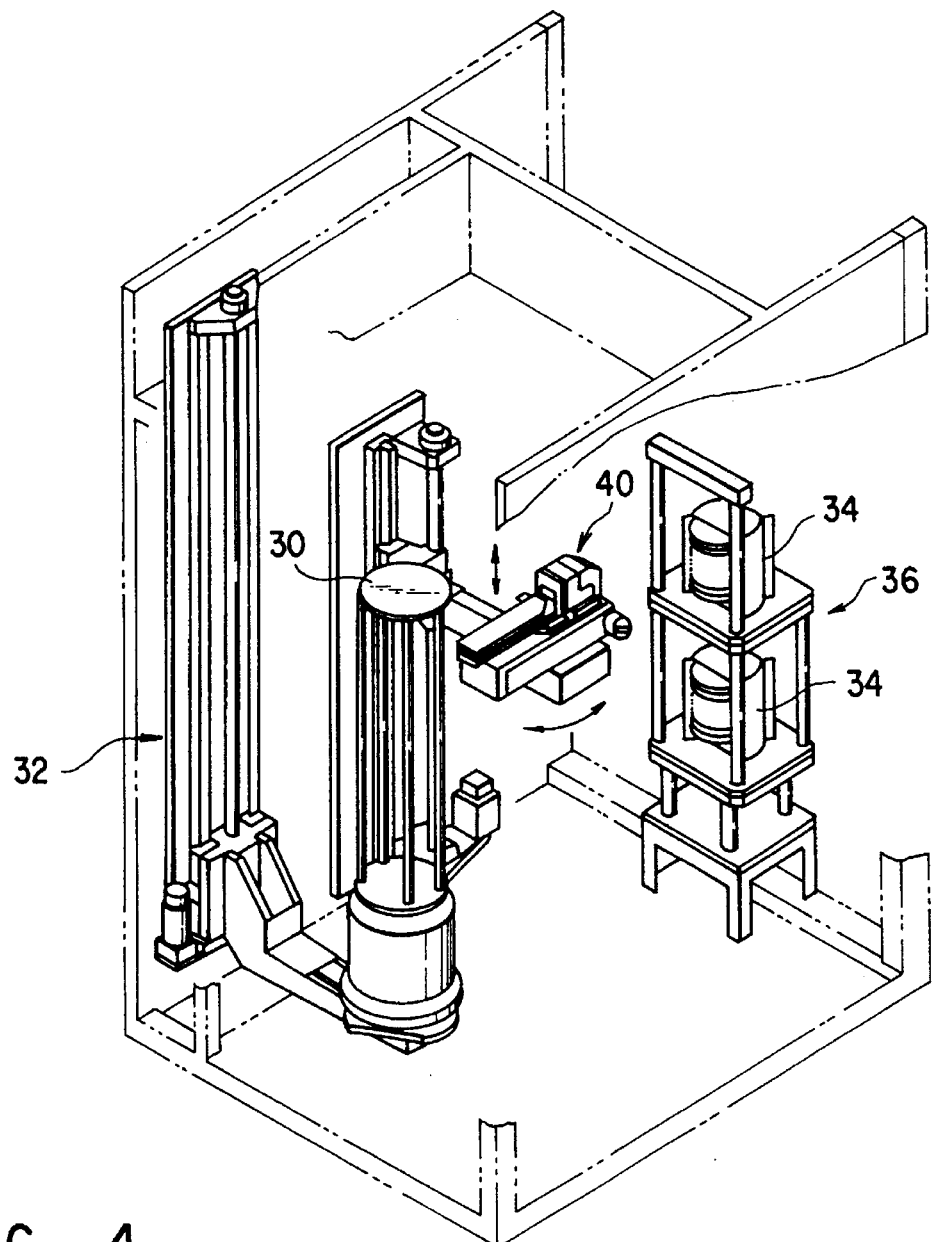
F I G. 4

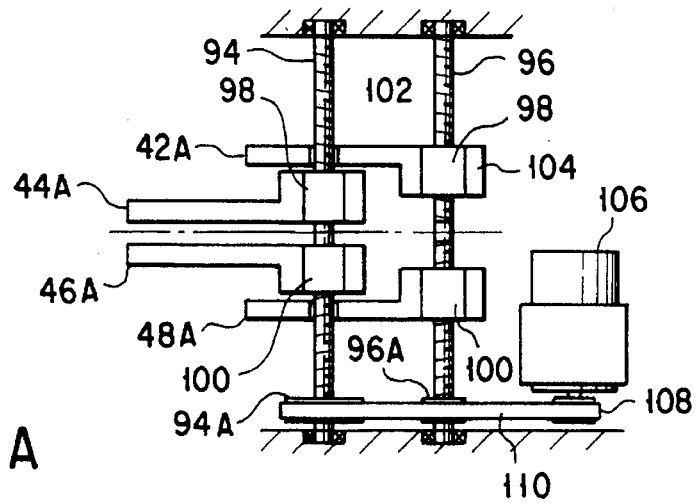
F I G. 13A
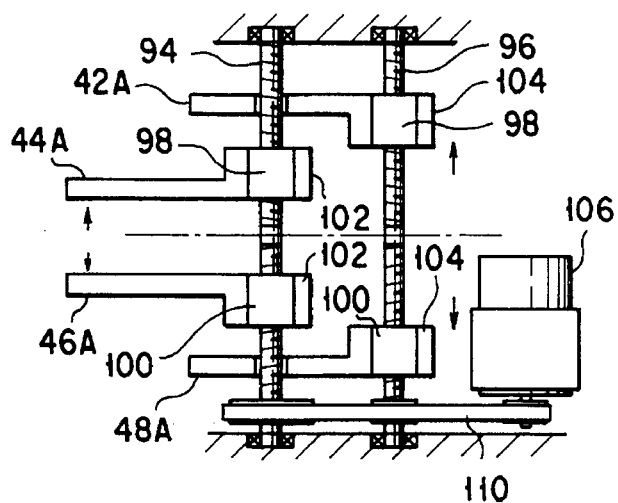
F I G. 13B
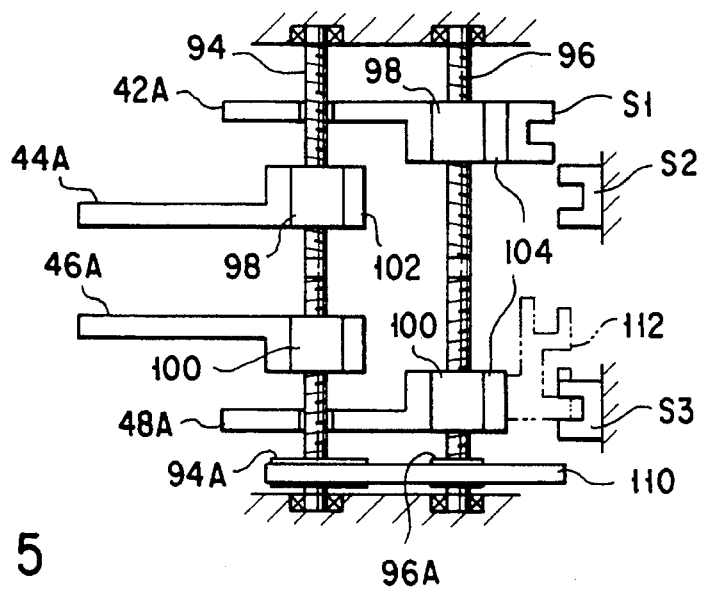
F I G. 15

DEVICE FOR TRANSFERRING PLATE-LIKE OBJECTS

BACKGROUND OF THE INVENTION

1. Field of the Invention

The present invention relates to a device for transferring plate-like objects such as semiconductor wafers.

2. Description of the Related Art

The semiconductor wafer processing apparatuses have a carrier mechanism or device for transferring or carrying wafers, which will be loaded into and unloaded from a process section, into a housing section such as the cassette. One of these wafer processing apparatuses which use this carrier mechanism is the heat processing apparatus. This heat processing apparatus is intended to oxidize, diffuse and anneal the wafer or film-form on it. Plural sheets of semiconductor wafers are transferred from the cassette into a boat, which will be loaded into a heat processing tube, in the heat processing apparatus, or these semiconductor wafers which have been unloaded from the heat processing tube are transferred from the boat into the cassette in it.

As shown in FIG. 1, the carrier device is arranged in a load/unload section of the heat processing apparatus to transfer semiconductor wafers between the cassette and the boat. It is intended to increase throughput in the course of making semiconductor devices, and it can carry the wafers all at once. The carrier device has an arm mechanism 10 rotatable, movable up and down and reciprocatable. This arm mechanism 10 has a wafer-mounted section, on which five sheets of wafers can be mounted, at the front end of an arm. It can transfer five sheets of wafers all at once between the cassette 12 and the boat 14.

On the other hand, it is sometimes needed that only one sheet of monitor or dummy wafer is transferred into the boat 14. In addition to the above-mentioned plural wafers carrying arm mechanism, therefore, a one wafer carrying arm mechanism is needed.

As shown in FIG. 3, the single and plural sheets carrying arm mechanisms 22 and 20 are arranged one upon the other in the conventional carrier device, and the single sheet carrying arm mechanism 22 is driven independently of the plural sheets one 20. Five sheets carrying arms 20A are arranged at a same pitch interval but the single sheet carrying arm 22A has no pitch interval relative to the plural sheets ones 20A. In short, the interval of the single sheet carrying arm 22A relative to the plural sheets ones 20A is larger than the pitch interval at which the plural sheets carrying arms 20A are arranged one another. This is intended to prevent both of the arms 20A and 22A from interfering with each other when they are being moved. Therefore, the space the conventional carrier device occupies is large and the device itself is also large in size.

Further, both mechanisms 20 and 22 are driven independently of the other. This makes it necessary to independently position each of them. Teaching procedure which is carried out in a drive section to position each of them becomes complicated accordingly, and positioning error thus obtained may be large. Both of the mechanisms 20 and 22 are also assembled independently of the other. This increases the number of parts used and the number of assembling steps for them. Cost for each mechanism, therefore, becomes high.

SUMMARY OF THE INVENTION

The object of the present invention is therefore to provide a plate-like object carrier device capable of transferring or carrying plural plate-like objects together as well as a single one alone but without becoming large in size and without increasing the number of component parts used and the steps of assembling them.

According to an aspect of the present invention, there can be provided a device for transferring or carrying plate-like objects comprising: plural arms having a single arm and a group of arms, arranged at a substantially same pitch interval to horizontally support a plate-like object on each of the arms; first drive means for driving the single arm forward and backward independently of the group of arms; second drive means for driving the group of arms forward and backward at the same time except the single arm; a power supply for supply power to the first and second drive means; and control means for selecting whether to supply power from the power supply only to the first drive means or to both of the first and second drive means.

According to another aspect of the present invention, there can be provided a device for transferring or carrying plural plate-like objects together, which are arranged at a substantially same pitch interval, into or out of a section, while taking a center reference position as the reference, comprising: plural pairs of arms arranged in symmetrically relative to the center reference position to horizontally support the plate-like object on each of the arms; and pitch changing means for moving the paired arms up and down and symmetrically relative to the center reference position to change the pitch interval between the adjacent two of the plate-like objects.

The above-mentioned pitch changing means comprises the charging means has slide guide members connected to the corresponding paired arms; plural screws for supporting the slide guide members movable for every pair of arms; means for driving or rotating the screws at the same time; and means for transmitting rotation force from the drive or rotation means to each of the screws; wherein each of the screws has a screw thread on an upper half thereof, which is located above the center reference position, extending along it in a direction, and it also has another screw thread on a lower half thereof, which is located below the center reference position, extending along it in another direction reverse to the above direction, and wherein the rotation transmitting means adjusts the number of rotations transmitted to each of the screws in such a way that paired arms can be arranged symmetrically and at a same pitch interval relative to the center reference position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a perspective view showing the whole of the carrier device for plate-like objects according to an embodiment of the present invention;

FIG. 13A is a sectional view showing the pitch changing mechanism seen before it is operated to change the pitch;

FIG. 13B is a sectional view showing the pitch changing mechanism seen after it is operated to change the pitch;

FIG. 15 is a sectional view showing a detector for detecting the distance of each carrier arm moved.

DETAILED DESCRIPTION OF THE PREFERRED EMBODIMENTS

Figure 1:
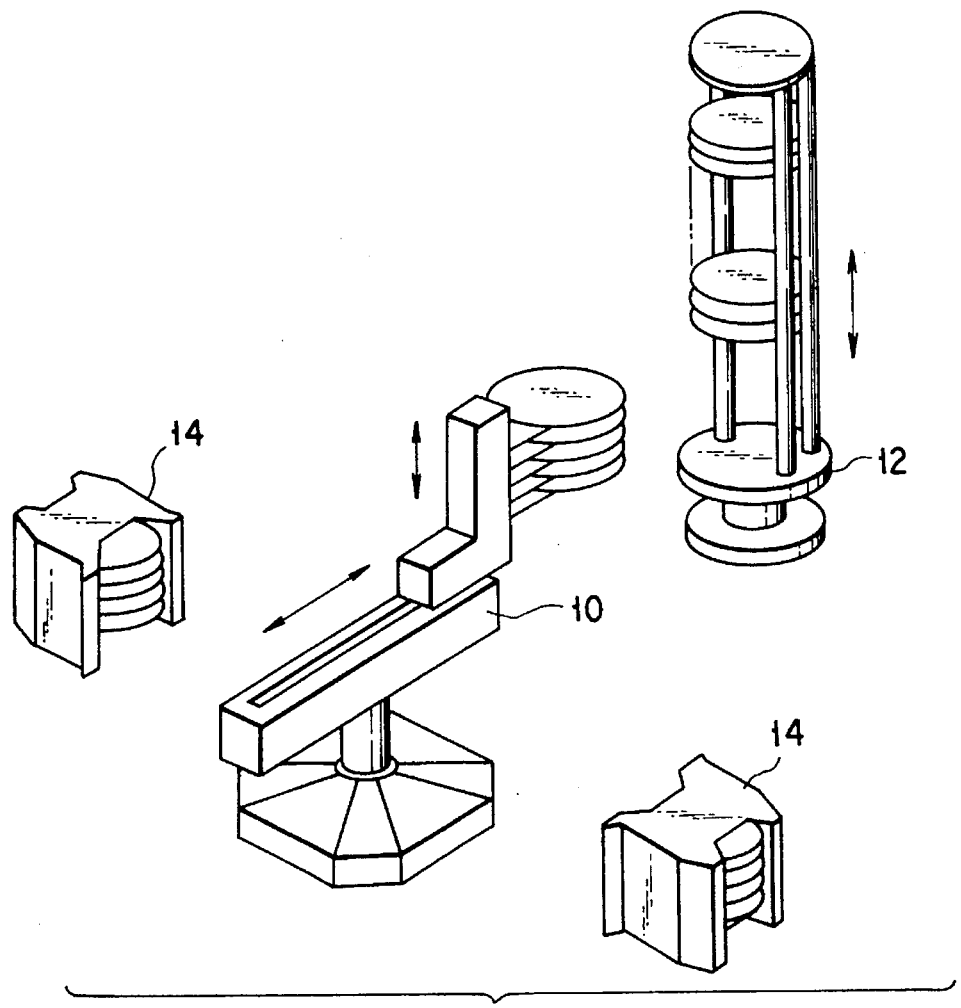
FIG. 1 is a perspective view showing the whole of the conventional device.

Some embodiments of the present invention will be described in detail with reference to the accompanying drawings.

As shown in FIG. 4, a wafer transfer section is arranged just under the heat process tube (not shown) in the heat process apparatus of the vertical type. A wafer boat 30 is housed in the wafer transfer section and a carrier device 40 for plate-like objects is arranged adjacent to the boat 30. The boat 30 is supported, movable up and down, by an elevator 32 so that it can be loaded into and unloaded from the heat process tube. A cassette stage 36 is also arranged in the wafer transfer section and plural cassettes 34 in each of which plural sheets of semiconductor wafers W are held are housed in the cassette stage 36. The plate-like object carrier device 40 is arranged between the boat 30 and the cassette stage 36.

The carrier device 40 is mounted on a stage which is movable up and down and rotatable, and it can be thus moved along an axis Z and rotated round it by an angle O. Each arm 50 of the carrier device 40 is supported by a drive mechanism to move forward and backward in a horizontal plane.

Figure 5:
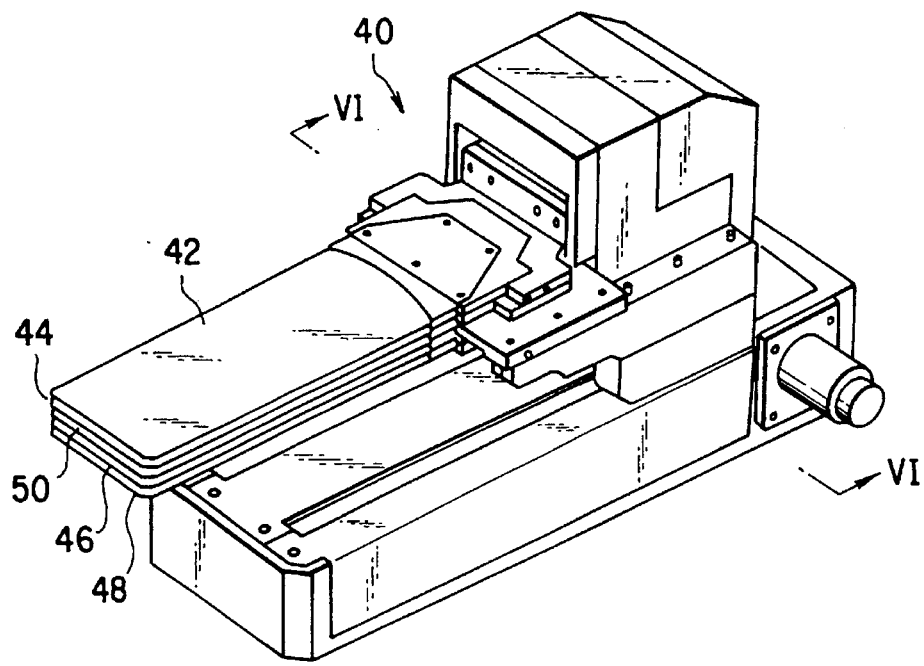
FIG. 5 is a perspective view showing a carrier arm assembly of our device.

As shown in FIG. 5, the carrier device 40 has five rectangular arms 42, 44, 46, 48 and 50, which are arranged parallel to one another at a same pitch interval. A sheet of wafer W is mounted on each of the arms 42, 44, 46, 48 and 50. The arm 50 positioned in the center of them is driven forward and backward independently of the others. The position of the arm 50 is called center reference position.

Figure 6:
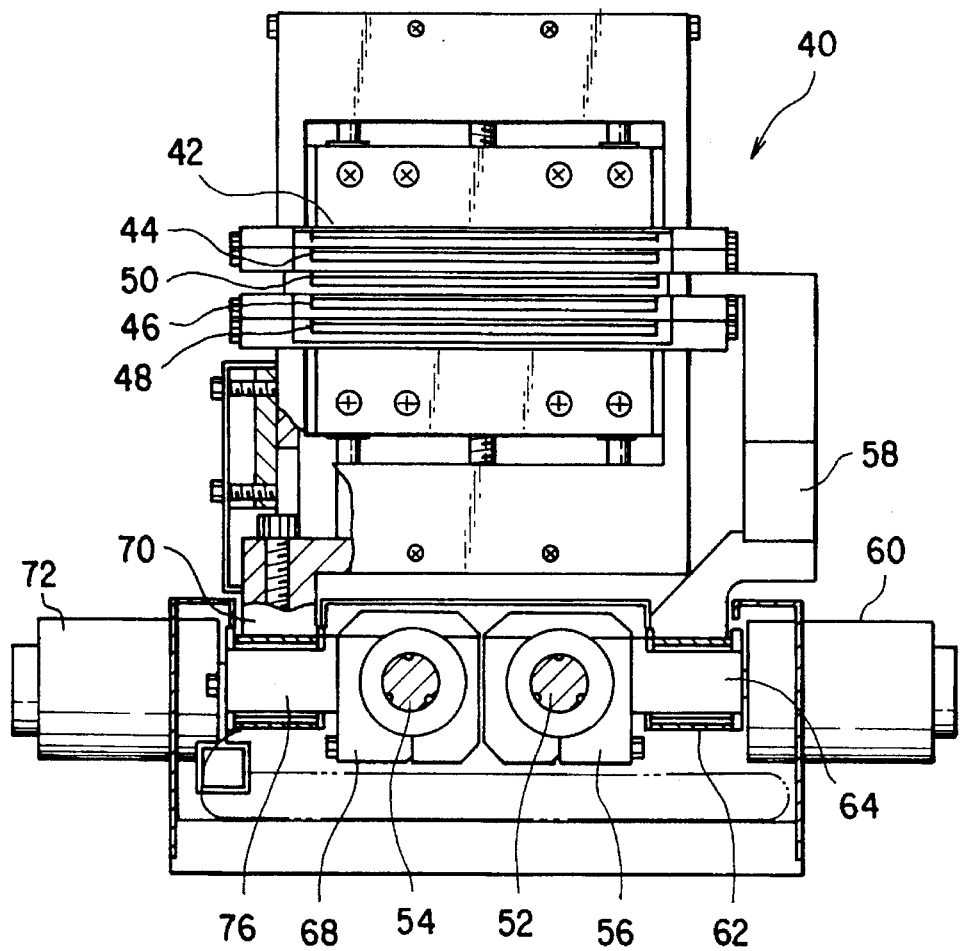
FIG. 6 is a sectional view showing the carrier arm assembly of our device.

As shown in FIG. 6, a pair of ball splined shafts 52 and 54 are housed in a box which is positioned under the carrier device 40. These paired ball splined shafts 52 and 54 extend along the longitudinal line of the arm 50 and both ends of each shaft are supported rotatable. A slide block 56 is fitted onto the ball splined shaft 52 to support the center arm 50. This slide block 56 fitted onto the ball splined shaft 52, however, can be held not rotatable in relation to the shaft 52. The slide block 56 includes a support arm 58 by which the center arm 50 is supported in the cantilever manner. It can slide on the ball splined shaft 52 and its slide is made possible by a timing belt 62 to which the drive force of a first stepping motor 60, which serves as first drive source, is transmitted.

Figure 7:
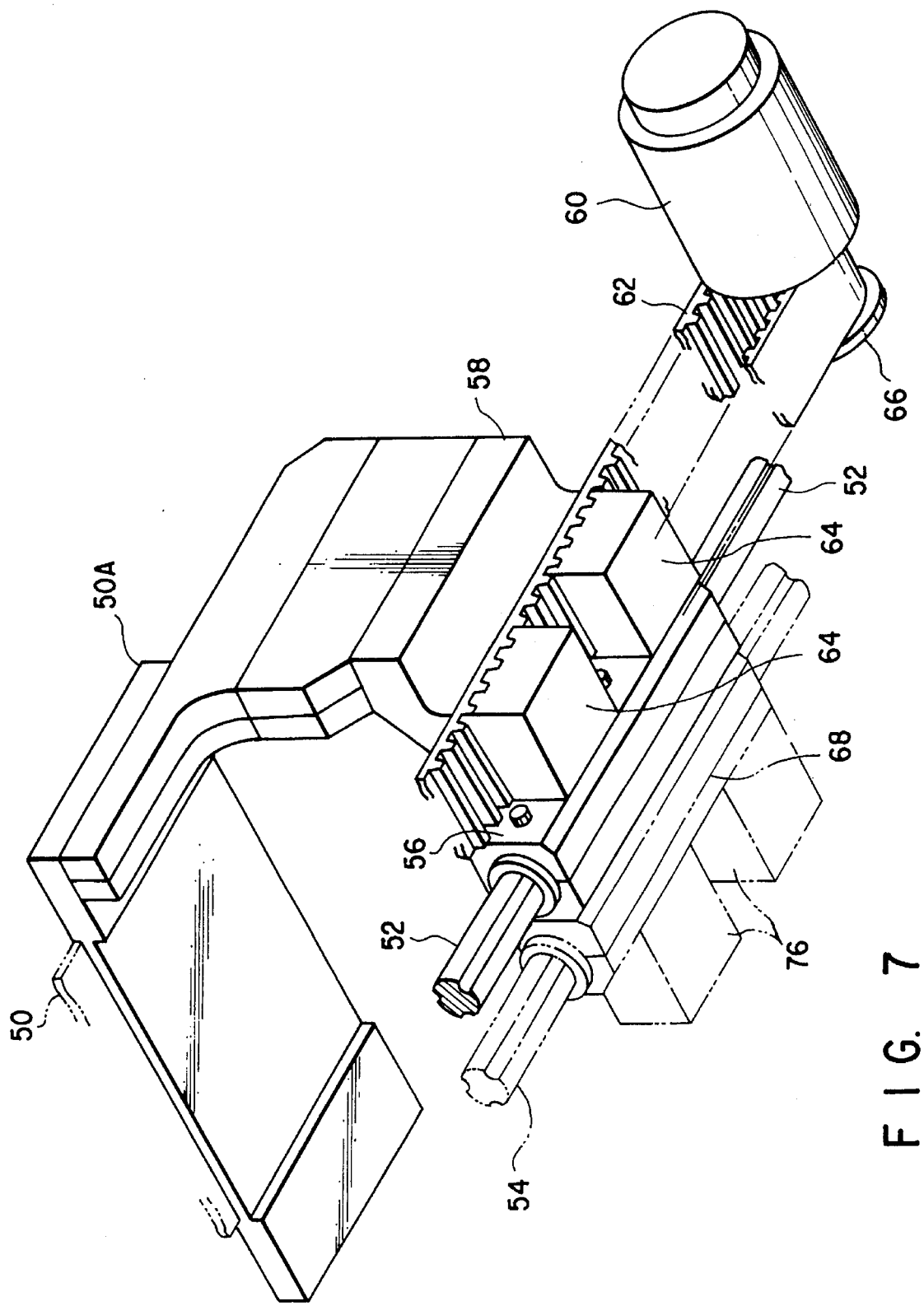
FIG. 7 is a perspective view showing a drive section of our carrier arm assembly dismantled.

As shown in FIG. 7, a part of the timing belt 62 is sandwiched between tops of fixing blocks 64, which are made integral to the slide block 56, and the bottom of the support arm 58, which is located above the fixing blocks 64. The timing belt 62 is thus made integral to the center arm 50. As a result, the rotating force of the stepping motor 60 is transmitted to the slide block 56 through the timing belt 62 and when the slide block 56 is driven in this manner, the center arm 50 can be moved forward or backward.

As shown in FIG. 6, another slide block 68 which supports the other four arms 42, 44, 46 and 48 through a support arm 70 is fitted onto the other ball splined shaft 54. It is held there not rotatable also in this case relative to the ball splined shaft 54. However, it can slide on the ball splined shaft 54 and its slide can be attained by a timing belt 74 to which the drive force of a second stepping motor 72, which serves as second drive source, is transmitted.

Figure 8:
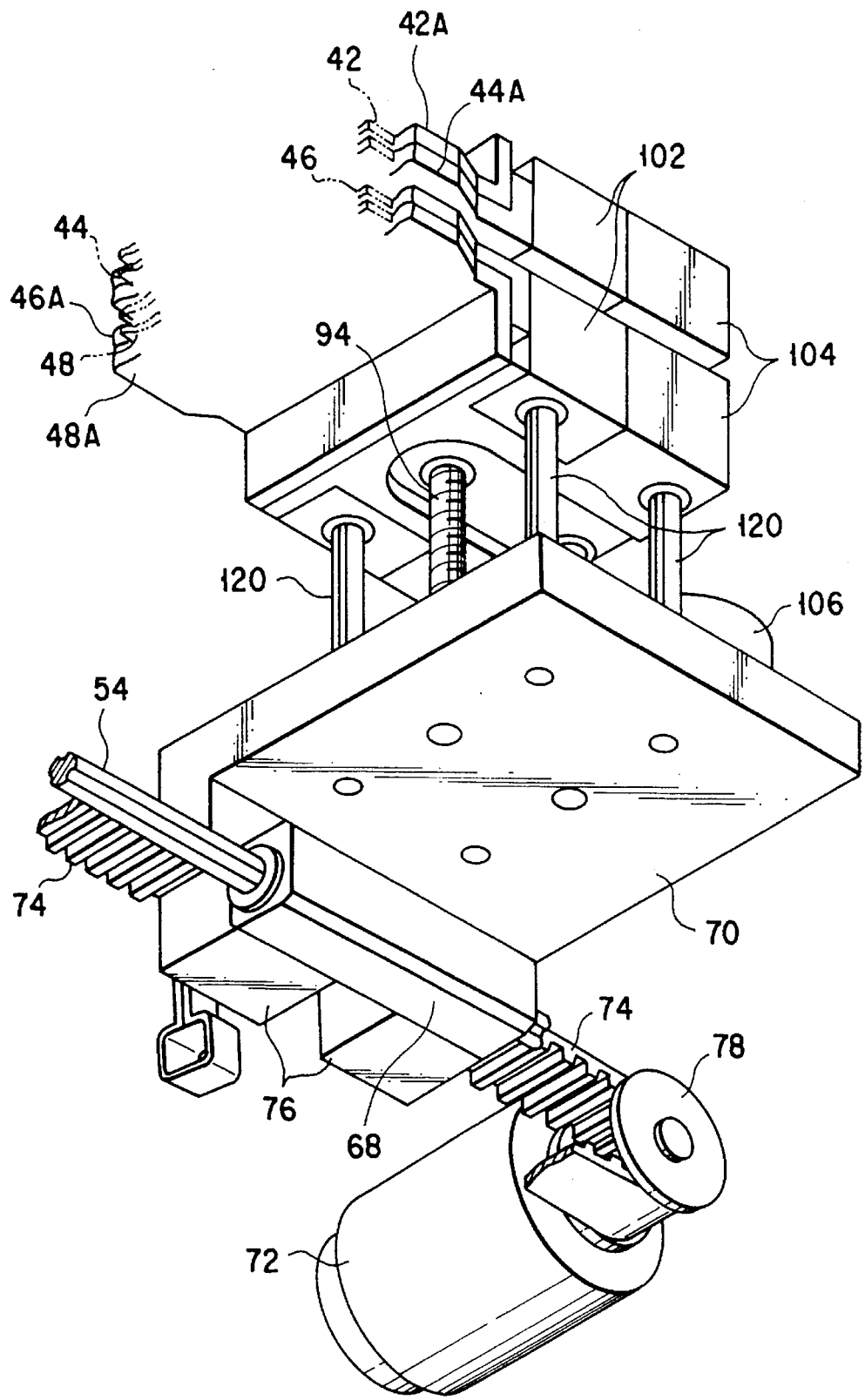
FIG. 8 is a perspective view showing a drive section of a carrier arm assembly of our device dismantled, our device being made according to another embodiment of the present invention in this case.

As shown in FIG. 8, a part of the timing belt 74 is sandwiched between tops of fixing blocks 76, which are made integral to the slide block 68, and the bottom of the support arm 70, which is positioned above the fixing blocks 76. The timing belt 74 can be thus made integral to the arms 42, 44, 46 and 48. As a result, the rotating force of the stepping motor 72 can be transmitted to the slide block 68 through the timing belt 74 and when the slide block 68 is driven in this manner, the arms 42, 44, 46 and 48 can be moved forward or backward.

Figure 10:
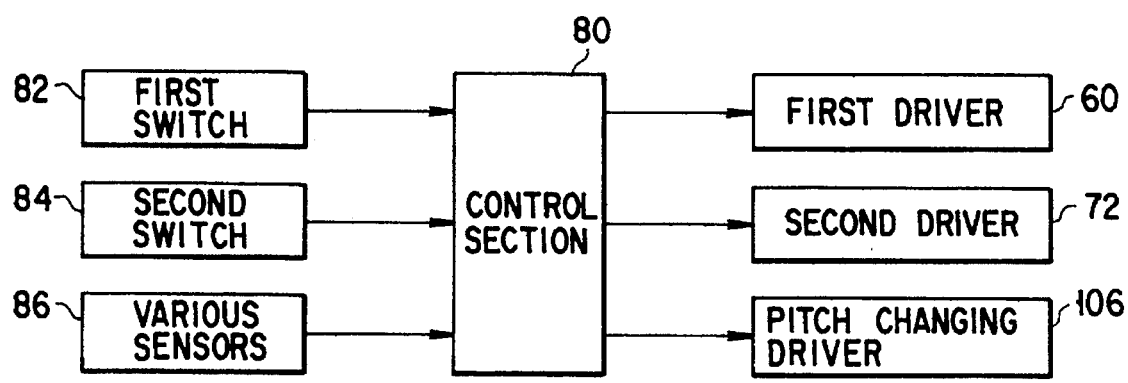
FIG. 10 is a block diagram showing a control section for our device.

Referring to FIG. 10, it will be described how forward and backward movements of the carrier arms are controlled.

A control section 80 houses a microcomputer and power sources in it. First and second switches 82 and 84 and various kinds of sensor 86 are connected to the input side of its microcomputer, while first and second drive sources 60 and 72 and a pitch changing drive source 106 to the output side thereof.

Figure 9:
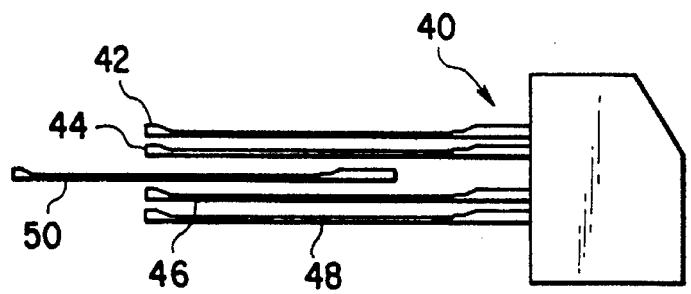
FIG. 9 is a side view showing the carrier arm assembly of our device.

The first (or single-sheet-feeding) switch 82 is connected to the first stepping motor 60 via an I/O interface (not shown). The second (or plural-sheet-feeding) switch 84 is connected to the first and second stepping motors 60 and 72 via an I/O interface (not shown). Selection is manually made about which of the first and second switches 82 and 84 to be turned on and off. In addition, they can be set to automatically turn on and off according to a sequence program, that is, they can be automatically turned on and off, responsive to those positions and number of wafers in the cassette which have been detected by a counter (not shown) when these wafers are to be transferred between the cassette and the boat. In short, the control section 80 can select either of the first and second switches 82 and 84, responsive to detection signals applied from the sensors 86 or according to a predetermined recipe.

when only a sheet of wafer W is to be carried by the plate-like object carrier device 40, as shown in FIG. 9, the first switch 82 is turned on to drive only the center arm 50 forward and backward. When five sheets of wafers W are to be carried together, the second switch 84 is turned on to drive the center arm 50 and the other ones 42, 44, 46, 48 forward and backward at the same time.

The plate-like object carrier device according to another embodiment of the present invention and provided with a pitch changing mechanism 90 will be described referring to FIGS. 11 through 15.

The pitch changing mechanism 90 is housed in a box 92 attached to the support arm 70, and it has a pair of screws 94 and 96 each of which is supported, rotatable, at its both ends between the support arm 70 and the ceiling of the box 92. A forward screw thread is formed on the lower half of each of the screws 94 and 96, while a backward screw thread on the upper half of each of them. These forward and backward screw threads are formed at a same pitch.

Figure 11:
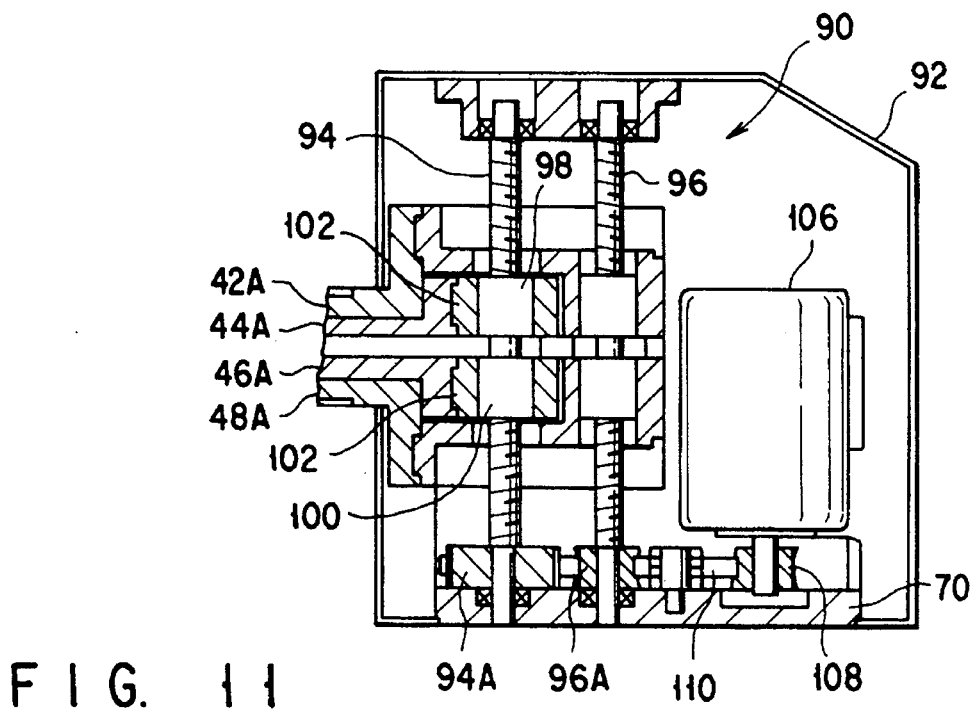
FIG. 11 is a sectional view showing a pitch changing mechanism of our carrier device.

As shown in FIG. 11, a pair of ball nuts 98 and 100 are screwed onto each of the screws 94 and 96. These ball nuts 98 and 100 are moved, departing from each other, in reverse directions as the screws 94 and 96 are rotated. While leaving the center arm 50 as it is, therefore, the arms 42, 44, 46 and 48 are moved along the axis Z to thereby change the pitch interval between them.

Sleeves 102 are fixed to the ball nuts 98 and 100 attached to the screw 94. Plates 44A and 46A to which the arms 44 and 46 are attached are attached to the sleeves 102. Similarly, sleeves 104 are fixed to the ball nuts 98 and 100 which are screwed onto the other screw 96. Plates 42A and 48A to which the arms 42 and 48 are attached are supported by the sleeves 104.

Figure 12A:
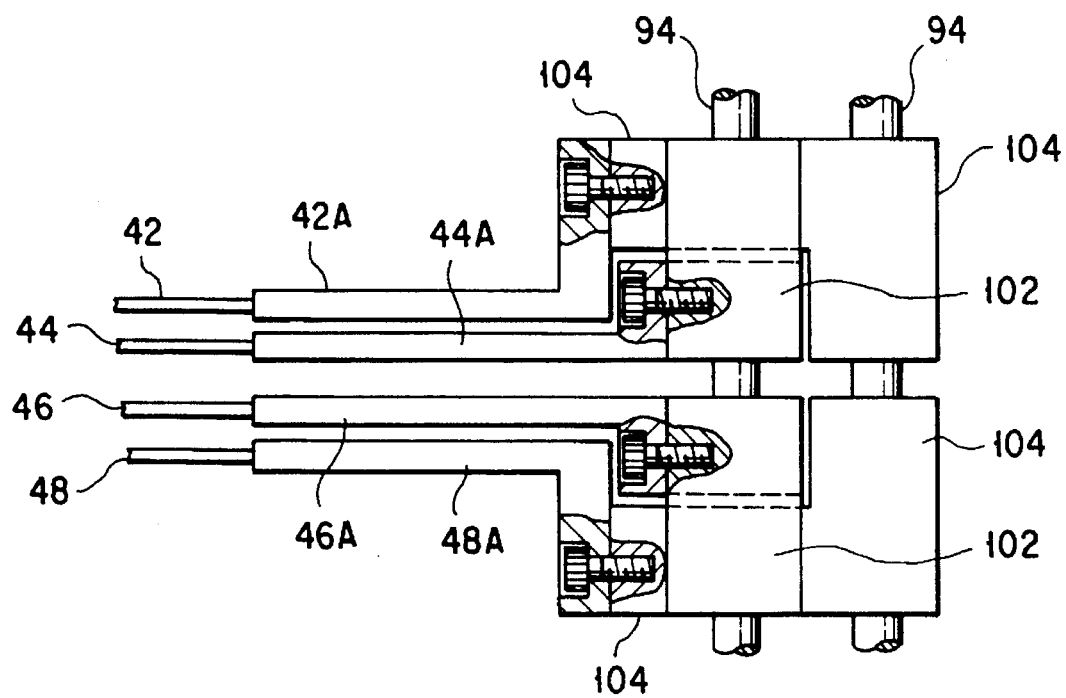
FIG. 12A is a partly-sectioned view showing those portions to which carrier arms are attached.
Figure 12B:
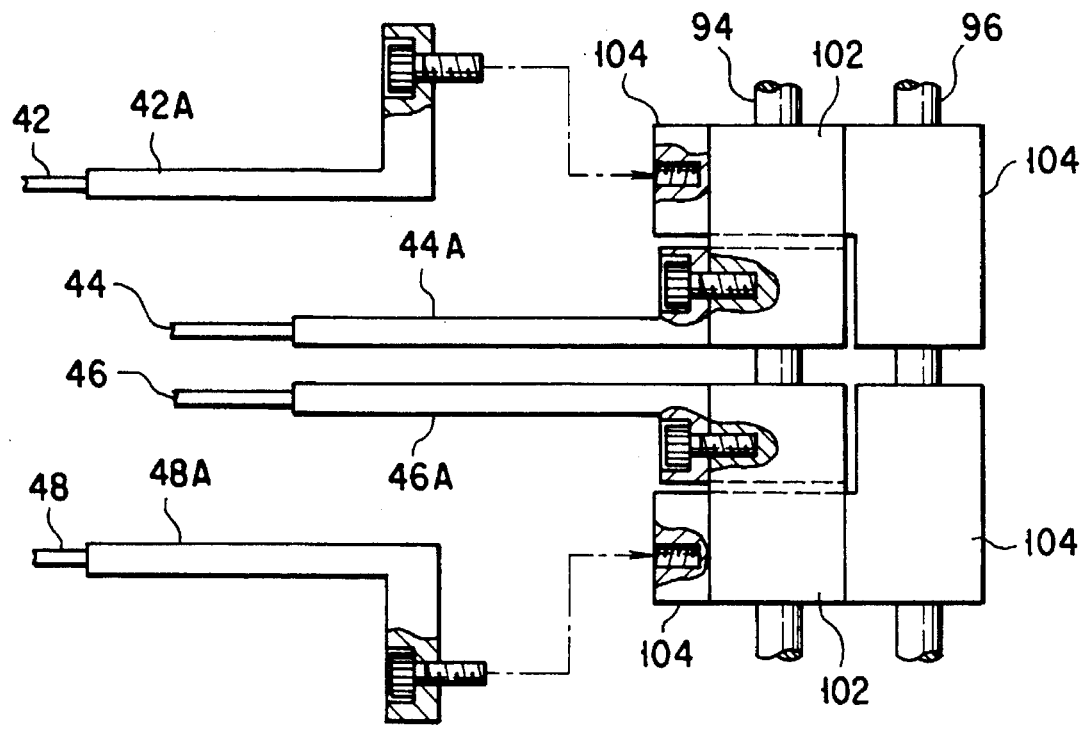
FIG. 12B is a sectional view showing carrier arms detached.

As shown in FIG. 12A, those portions of the plates 42A and 44A which are opposed to their arm-attached portions are bent, as basic portions, at right angle and this bent basic portion of the plate 42A overlaps that of the plate 44A when they are attached to the sleeves 102 and 104 by screws. Same thing can be said about the plates 46A and 48A. When basic portions of the arm-attached plates 44A and 46A are attached to the sleeves 102, those portions of the sleeves 104 to which basic portions of the plates 42A and 48A will be next attached are exposed or left free, as shown in FIG. 12B, and this makes it possible to freely attach and detach the plates 42A and 48A to and from the sleeves 104. In addition, basic portions of the arm-attached plates 42A, 44A, 46A and 48A are bent so that the interval between the adjacent two of arms 42 to 48 can be made small.

As shown in FIGS. 13A and 13B, large and small pulleys 94A and 96A are attached to bottom ends of the screws 94 and 96. A timing belt 110 is stretched, extending round the two pulleys 94A, 96A and the drive shaft of a stepping motor 106. The diameter of the large pulley 94A is two times that of the small one 96A. The pitch changing mechanism 90 is under such a state as shown in FIG. 13A before the pitch interval is changed and it is under such a state as shown in FIG. 13B after the pitch interval is changed. The adjacent two of the arms 42 to 48 (or plates 42A to 48A) can be kept same in pitch interval in these cases. The sleeves 102 and 104 are guided along guide shafts 120.

Figure 14A:
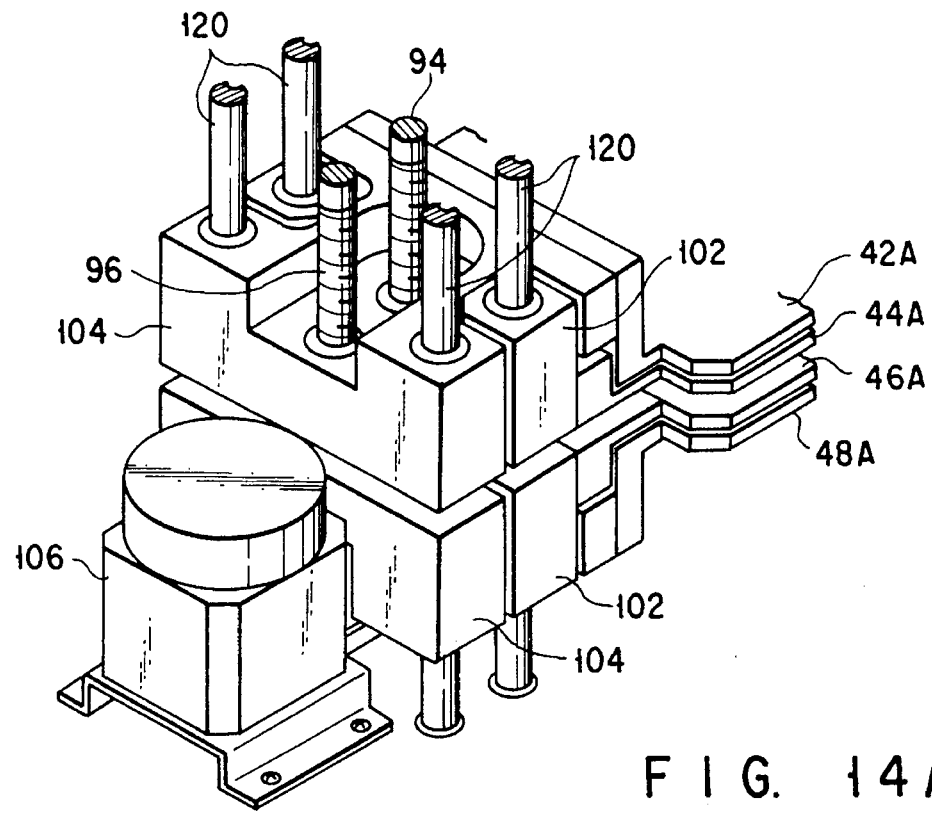
FIG. 14A is a perspective view showing the pitch changing mechanism seen before it is operated to change the pitch.
Figure 14B:
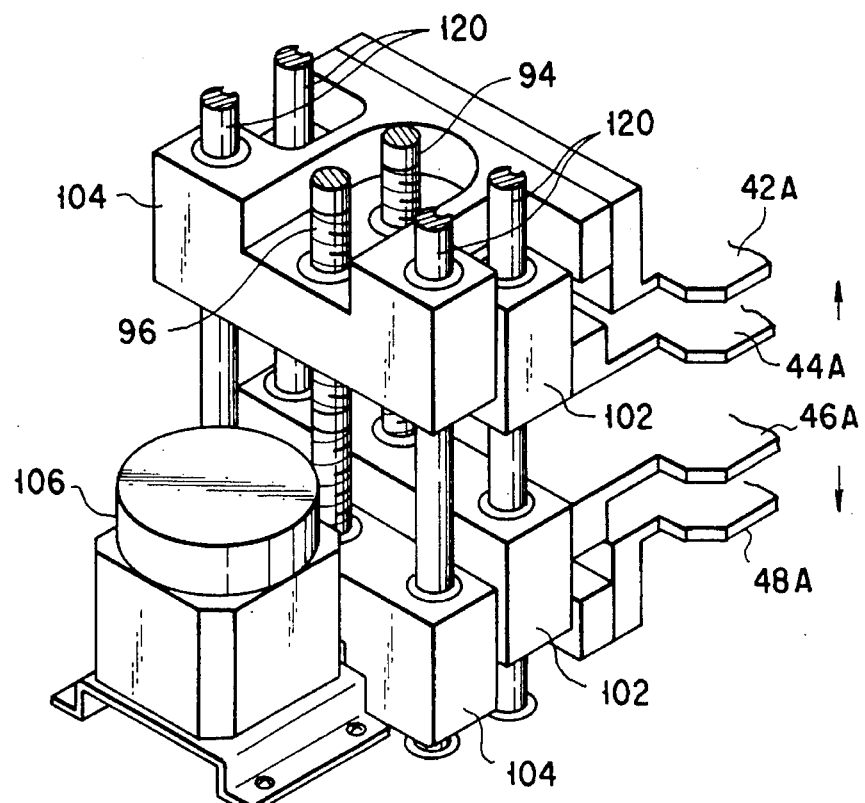
FIG. 14B is a perspective view showing the pitch changing mechanism seen after it is operated to change the pitch.

As shown in FIGS. 14A and 14B, the guide shafts 120 are of the ball splined type and they are fitted into the ball nuts 98 and 100 in the sleeves 102 and 104. When this ball splined mechanism is employed, play between component parts can be kept smaller and the arms 42 to 48 can be positioned with a higher accuracy.

When the adjacent two of the arms 42 to 48 are to be separated from each other to enlarge the pitch interval in this example, it is a must that they are placed one above the other. The screws 94 and 96, therefore, must stop their rotation at the time when the arms 42 to 48 come to their positions at which they are placed one above the other.

When it is assumed in this example that the minimum pitch interval between the adjacent two of semiconductor wafers which are to be transferred onto the carrier arms be set 4.8 mm and that the pitch interval between the adjacent two of arm-attached plates be set 4.6 mm, considering the strength of each carrier arm and its processing error relative to the size of each semiconductor wafer W transferred, therefore, up and down movements of arms are stopped in a limit range of 0.2 mm which is the difference between the pitch intervals 4.8 mm and 4.6 mm. As the result, the arm-attached plates can be placed one above the other. Therefore, the stepping motor 106 is stopped at the time when the distance of a single arm-attached plate moved is detected to be same as the above-mentioned difference of 0.2 mm.

However, it is practically difficult to detect the distance of 0.2 mm by which the arm-attached plate is moved. It is arranged, therefore, in this example that the distance of arm-attached plates 42A and 48A moved, which is larger than that of arm-attached plates 44A and 46A moved, is detected. As shown in FIG. 15, an optical sensor S1 is attached to one sleeve 104 while a light shielding member 112 to the other sleeve 104. The distance of sleeves 104 moved as the screw 96 rotates becomes two times that of sleeves 102 moved. In short, it becomes equal to $\{0.2 \times 2 \times 2\}$ mm. This stroke (0.8 mm) is employed as a range to be detected by the optical sensor S1. This makes it easier to detect the distance as compared with the case where the smaller stroke is detected. To add more, symbol S2 in FIG. 15 represents an origin sensor and symbol S3 an end limit sensor.

When wafers W are to be transferred between the boat 30 and the cassette 34, the carrier arms are positioned in the vertical direction of the device 40, taking the position of the center arm 50 as the reference, whichever switch 82 or 84 is turned on.

When the first switch 82 is turned on, the center arm 50 is driven forward and backward. In short, pulse signals are applied to the first stepping motor 60 to rotate it. Prior to this, however, it is detected by an optical sensor or encoder (which is one of the various sensors represented by 86 in FIG. 10) whether or not the slide block 56 which serves to move the center arm 50 and which is made integral to the timing belt 62 is placed at its start position. Only when it is at its start position, the number of rotation pulses which corresponds to the distance of the center arm 50 moved forward is applied to the first stepping motor 60. The direction and number of the stepping motor 60 rotated are thus set to move the center arm 50 forward and backward.

When the second switch 84 is turned on, the second stepping motor 72 as well as the first one 60 is driven. Before they are rotated, however, it is detected also in this case whether or not the slide block 56 for the center arm 50 and the other slide block 68 which serves to move the carrier arms 42, 44, 46 and 48 forward and which is made integral to the timing belt 74 are placed at their start positions.

When it is detected that all of the arms 42 to 50 are placed at their start positions, the control section 80 applies on- and off-signals to the first and second stepping motors 60 and 72. The arms 42, 44, 46 and 48 as well as the center one 50 are thus driven forward and backward by the timing belts 62 and 74.

When the arms 42 to 50 are moved forward and backward particularly to carry plural wafers together, the pitch interval between the adjacent two of them is changed corresponding to the pitch interval between the adjacent two of the wafers carried. In short, the arms 42, 44, 46 and 48 can be moved relative to their corresponding one, taking the position of the plate 50A for the center arm 50, which is placed in the center of them, as their reference. In addition, the pitch interval between the arms 44 and 46 can be made equal to that between the arms 42 and 48 due to the rate of rotation numbers between the screws 94 and 96.

Figure 2:
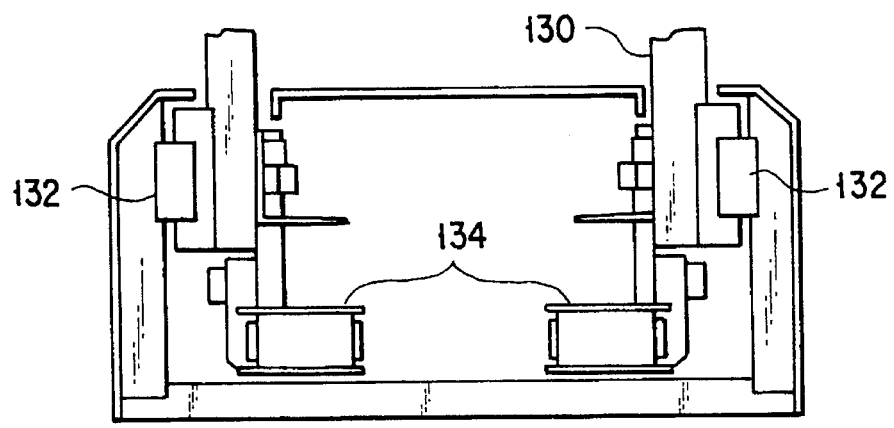
FIG. 2 is a sectional view showing a part of the inside arrangement in the conventional device.
Figure 3:
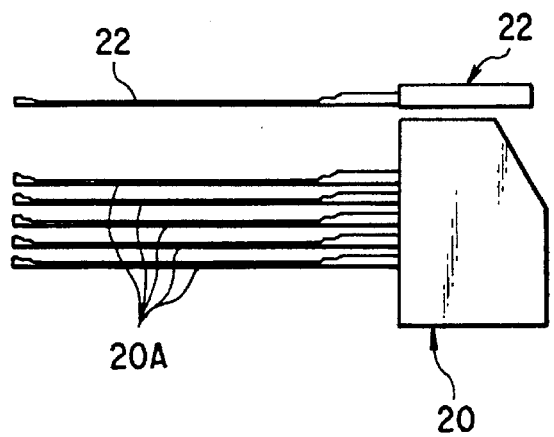
FIG. 3 is a side view showing the carrier arm assembly of the conventional device.

The above-described device can be made lower in height and more compact in structure because the screws 94 and 96 in it can be made short. Further, no drive section is present under the slide blocks and this space can be therefore used as a wiring section for the drive sources of the pitch changing mechanism. This is because the slide guide section employs the above-mentioned ball splines. The slide guide section is usually constructed in such a way that linear guides 132 each having a length needed to guide a slide block 130 are located beside the slide blocks 130, as shown in FIG. 2. In this case, however, the first and second drive sources cannot be located beside the slide blocks 130, and each of the drive shafts of the stepping motors must be placed along by the vertical axis of the device. Pulleys 134 to which the timing belt are attached are thus forced to come under the slide blocks 130. This makes it difficult to locate the wiring section under the slide blocks 130. When the space under the slide blocks 56 and 68 is left free for wiring, as shown in FIG. 6, the space under the slide blocks 130 can be prevented from becoming complicated as shown in FIG. 2.

According to the above-described device, each of the drive shafts of the stepping motors 60 and 72 is placed along by the horizontal axis of the device. Therefore, the timing belts can also be placed along by the horizontal axis thereof. When they are placed in this manner, slits of the box through the support arms are projected outside the box can be closed by them. Dust and particles caused by the drive sources in the box can be thus prevented from flowing to the wafer transferring section through the slits of the box.

It may be arranged that the rotation number of one screw is made equal to that of the other one to make different the distance of their one sleeve moved from that of their other sleeve moved.

The above-described plate-like object carrier device according to the present invention can be applied to each process in the semiconductor and liquid crystal manufacturing apparatuses as well as those in the heat process apparatus. It can be applied to the CVD, plasma processing and cassette and boat stocking apparatuses as well.

According to the present invention as described above, the plate-like object carrier device can be prevented from becoming large in size. Further, the number of component parts used can be made smaller and the manufacturing cost can be thus made lower. In addition, the teaching procedure due to carry plate-like objects can be made easier.

According to the present invention, the pitch interval between the adjacent two of the carrier arms can be changed, taking the position of that one, which is located in the center of them when uneven sheets of the arms are used, as their reference. This pitch changing process can be thus made easier while moving those carrier arms, which correspond to each other, over a same distance.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A device for collectively transferring a plurality of plate-like objects into and out of a processing apparatus for applying a treatment to said objects in a batch process, comprising:

plural arms including an intermediate single arm and a group of arms positioned to have said single arm interposed therebetween, and arranged at substantially the same vertical pitch to horizontally support the plate-like objects on main surfaces thereof;

first drive means for independently driving said intermediate single arm forward and backward;

second drive means for simultaneously driving said group of arms forward and backward;

sensor means for detecting the state of the plate-like object to be transferred;

drive force changing means for changing the drive force supplied to each of said first and second drive means; and control means for allowing said drive force changing means to change the drive force supplied to said first and second drive means based on the result of detection of said sensor means so as to drive at least one of the first and second drive means.

2. The device according to claim 1, wherein said group of arms include two upper arms positioned above said intermediate single arm and two lower arms positioned below said intermediate single arm.

3. The device according to claim 2, further comprising pitch changing means for moving each arm included in said upper and lower arms relative to said intermediate single arm to change the pitch of the plate-like objects supported by the upper, intermediate and lower arms.

4. The device according to claim 3, wherein each arm included in said upper and lower arms is mounted detachably from said pitch changing means.

5. The device according to claim 2, further comprising:

a first slider connected to said intermediate single arm and driven by said first drive means together with said intermediate single arm;

a second slider connected to each arm included in said upper and lower arms and driven by said second drive means together with each of said arms; and a shaft having a key groove for guiding each of said first and second sliders.

6. The device according to claim 1, further comprising:

a support member for supporting all of said plural arms; and elevator means for vertically moving said support member and said plural arms supported by said support member.

7. The device according to claim 1, further comprising:

a support member for supporting all of said plural arms; and swing means for swinging in a horizontal plane said support member and said plural arms supported by said support member.

8. The device according to claim 1, wherein each of said arms has a rectangular main surface.

9. The device according to claim 1, wherein said plate-like object is a semiconductor wafer which is to be subjected to a heat treatment.

* * * * *